(12) United States Patent
Nightingale et al.

(10) Patent No.: US 6,459,287 B1
(45) Date of Patent: Oct. 1, 2002

(54) ATTACHABLE/DETACHABLE PROBING POINT

(75) Inventors: Mark W. Nightingale, Washougal, WA (US); David W. Simmen, Portland, OR (US); Phillip D. Applebee, Canby, OR (US); R. Kenneth Price, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/860,964

(22) Filed: May 18, 2001

(51) Int. Cl.$^7$ ............................................. G01R 31/02
(52) U.S. Cl. ..................... 324/754; 324/158.1; 324/72.5
(58) Field of Search .............................. 324/158.1, 754, 324/761, 758, 149, 757, 762, 763, 72.5; 439/482, 700

(56) References Cited

U.S. PATENT DOCUMENTS 4,528,500 A  *  7/1985  Lighbody et al. .......... 324/72.5
4,739,259 A  *  4/1988  Hadwin et al. ........... 324/158.1

* cited by examiner

Primary Examiner—Michael Sherry
Assistant Examiner—Jimmy Nguyen
(74) Attorney, Agent, or Firm—William K. Bucher

(57) ABSTRACT

An attachable/detachable probe point for use with an electrical measurement probe includes a base having a aperture formed therein that extends through the base. An electrically conductive probing contact having at least a partially threaded body member and a pointed contact member is disposed in the aperture with a portion of the body member extending from the top surface of the base and the pointed contact member extendable from a first position within the aperture to a second protruding position outside the aperture at the bottom surface of the base. A compliant adhesive material formed on the bottom surface of the base for securing the attachable/detachable probe point to probing contact point.

16 Claims, 4 Drawing Sheets

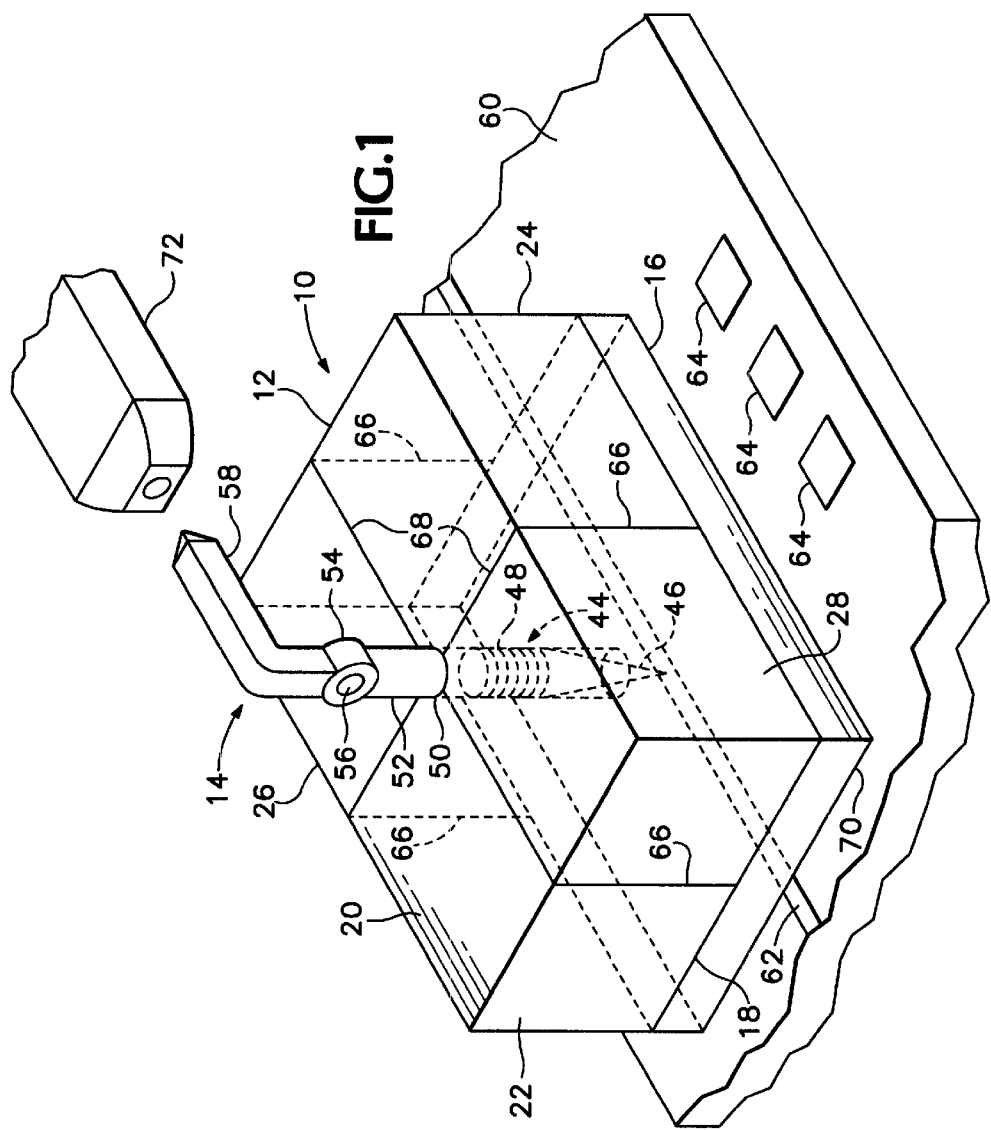

ATTACHABLE/DETACHABLE PROBING POINT

BACKGROUND OF THE INVENTION

The present invention relates generally to probing adapters and more specifically to a attachable/detachable probing point for use with an electrical measurement probe.

Electronic circuit board designs require prototyping and testing prior to release for production. This entails measuring signal at critical points in the circuit. Traditionally, electronic circuit boards have test point leads or square pins designed into the board layout to facilitate the measuring of signals at the critical points. As board layouts become more tightly packed and electrical signals on the boards increase in frequency, the use of test points and square pins are proving a detriment. The test points create capacitive loading on the circuit. They also create "shunts" or dead end signal paths where reflections may occur in the circuitry. They also radiate and pick-up signals like an antenna. Additionally, test points and square pins take up space on the circuit board that could be used for additional circuitry.

Not using test points and square pins on the circuit board results in the need to probe the traces and pads on the circuit board. This requires either holding the probe point on the trace or pad by hand or using a probe arm fixture. Holding a probe in place with one hand while operating a measurement instrument with the other hand is difficult. Holding more than one probe in place is also very difficult. Because of the close packing of the components and trace layouts on current board designs, a user runs the risk of shorting two pads or traces together when placing the probe point on the board. Using a probe arm fixture reduces this risk but also increases the cost of board development by the cost of the probe arm fixture and the set-up time required to position the probe arm and probe on the circuit board.

What is needed is an attachable/detachable probing adapter for use with electronic measurement probes that provides test points or square pin contacts as has been traditionally used in circuit board design along with hands-free probing associated with probe arm fixtures without the added cost of a probe arm fixture or permanent test points and square pins that act as antennas.

SUMMARY OF THE INVENTION

Accordingly, the present invention is to an attachable/detachable probe point adapter for use with a measurement test probe. The probe point adapter has a base with at least a first aperture formed therein that extends from a top surface to a bottom surface of the base. At least a first electrically conductive probing contact having at least a partially threaded body member and a pointed contact member is disposed in the aperture. A portion of the body member extends from the top surface of the base. The pointed contact member is extendable from a first position within the aperture to a second protruding position outside the aperture at the bottom surface of the base. A compliant adhesive material formed on the bottom surface of the base for securing the probe point adapter to a device under test.

The base is preferably formed of a non-conductive material and may be configured in a variety of shapes. In a first configuration, the base has opposing side surfaces and equal first and second perpendicular axes extending between opposing corners of the side surfaces resulting in a square configuration. The base may also be configured with unequal first and second perpendicular axes extending between opposing corners of the base resulting in a diamond configuration. The base may further be configured with a circular side surface defined by a radius extending from the center of the base. The aperture is positioned at the center of the base or at the intersection of the perpendicular axes. Preferably, the threaded portion of the probing contact is self-tapping and produces threads in the aperture. Alternately, the interior surface of the aperture may be formed with threads. At least two of the opposing sided surfaces preferably have at least an indicia mark formed thereon defining a line with the aperture positioned on the line.

The base may be further configured with a plurality of apertures formed therein with each of the apertures receiving a corresponding electrically conductive probing contact. Opposing side surfaces of the base may have a plurality of indicia marks formed thereon defining a plurality of lines with one of the plurality of apertures being positioned on each of the plurality of lines. The base may be further configured with a plurality of indicia marks formed on opposing sides of the base defining a plurality of lines that pass through one of the plurality of apertures.

The objects, advantages and novel features of the present invention are apparent from the following detailed description when read in conjunction with the appended claims and attached drawings.

BRIEF DESCRIPTION OF THE DRAWING FIGURES

FIG. 1 is a perspective view of one configuration of the attachable/detachable probe point adapter according to the present invention.

DETAILED DESCRIPTION OF THE PREFERRED EMBODIMENT

Figure 2A:
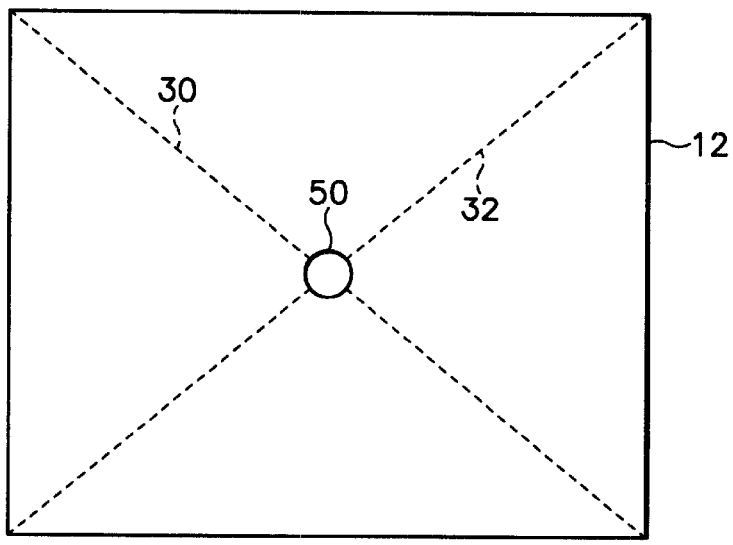
FIGS. 2A, 2B and 2C are top plan views of various configuration shapes of the base in the attachable/detachable probe point adapter according to the present invention.
Figure 2B:
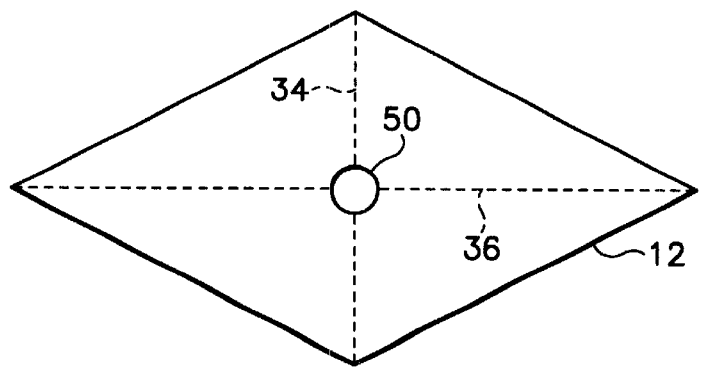
Figure 2C:
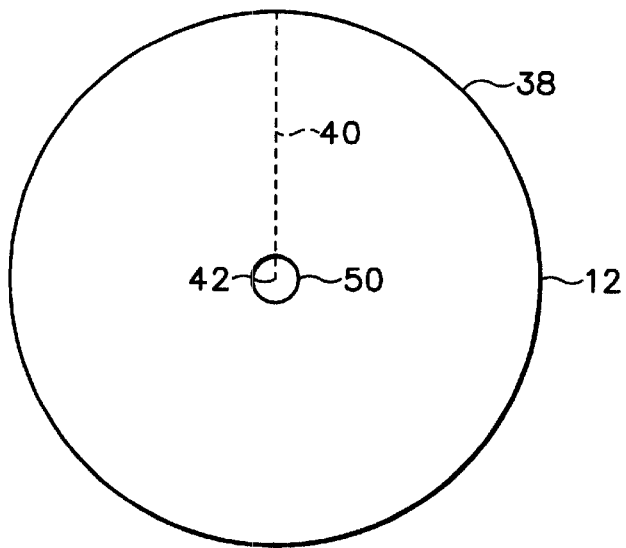

Referring to FIG. 1, there is shown a perspective view of a first configuration of the attachable/detachable probe point adapter 10 of the present invention. The attachable/detachable probe tip adapter has a base 12, at least a first electrically conductive probing contact 14 partially disposed within the base and a compliant adhesive material 16 disposed on the bottom surface 18 of the base 12. The base 12 is preferably formed of a non-conductive material, such as ABS plastic, polycarbonate or the like. The base has top and bottom surfaces 20 and 18 and opposing side surfaces 22 and 24 and 26 and 28. The base 12 may be configured in different shapes as representatively shown by the top plan views of the base in FIGS. 2A, 2B and 2C. In FIG. 2A, equally sized axes 30, 32 extend from the opposing corners of the base 12 resulting in a rectangular shaped base. In FIG. 2B, unequal perpendicular 34, 36 axes extend from the opposing corners of the base resulting in a diamond shaped base. In the preferred embodiment, the axes have lengths ranging from 0.100 to 0.300 inches. In FIG. 2C, the base 12 has a circular side surface 38 defined by a radius 40 extending from the center 42 of the base to the perimeter of the base. The length of the radius 40 in the range of 0.080 inches. The above described shapes for the base are by example only and other shapes for the base may be established, such as a square, elliptical, trapezoidal, random or the like, without departing from the scope of the appended claims.

Referring back to FIG. 1, the electrically conductive probing contact 14 has a partially threaded body member 44 and a pointed contact member 46. The pointed contact member 46 and the threaded portion 48 of the body member 44 are disposed in an aperture 50 with a further portion 52 of the body member 44 extending from the top surface 20 of the base 12. In the preferred embodiment of the invention, the diameter of the aperture 50 is slightly smaller than the threaded portion 48 of the body member 44 such that the threaded portion self threads as it is threaded into the aperture 50. Alternately, the interior surface of the aperture 50 may be formed with threads that mate with the threads of the threaded portion 48. The exposed portion 52 of the body member 44 may be configured in a number of forms with the configuration shown in the figure being one example. The exposed portion 52 extends upward from the base 12 and has a flattened portion 54 with a bore 56 formed there through. Above the flattened portion 54, the body member 44 is angled approximately ninety degrees to form a horizontal contact 58.

The electrically conductive probing contact 14 is preferably formed from beryllium-copper or other such electrically conductive material that is plated with an approximately 100 micron layer of nickel that is over-plated with a 30 micron layer of gold. The body member 44 tapers into the pointed contact member 46 below the threaded portion 48 of the body member 44. The pointed contact member 46 and the threaded portion 48 of the body member 44 have an overall length in the range of 0.250 inches with the threaded portion 48 having a diameter in the range of 0.030 inches. The portion 52 of the body member 44 extending upward from the base 12 has an overall length in the range of 0.120 inches with the horizontal contact 58 having a length in the range of 0.250 inches. Different sizes of contacts 58, such as 0.018, 0.025 and 0.050 square pins, may be formed from the body member.

The compliant adhesive material 16 is preferably a double sticky foam tape, such as manufactured and sold by Viscor, Inc., Dallas Tex. under part number 4E01-2DC1 Perm/Rem. The compliant adhesive material 16 has a preferred thickness in the range of one-sixteenth of an inch. The compliant adhesive material 16 is sized to conform to the shape of the base 12. One side of the double sticky foam tape is secured to the bottom surface 18 of the base 12. The opposite side of the foam tape has a removable sheet that prevents the exposed adhesive side of the tape from sticking to objects prior to use.

The attachable/detachable probe point adapter 10 is designed to provide a temporary test point or square pin connection to a device or circuit board 60 under test. The adapter 10 may be placed on circuit runs or traces 62, test pads 64, device pads and the like on the circuit board 60 or other types of circuit substrates. The adapter 10 is prepared for mounting on the circuit board 60 by removing the protective sheet from the compliant adhesive material 16. The pointed contact member 46 is disposed within the aperture 50 at this time. In the drawing of FIG. 1, the adapter 10 is placed on a circuit trace 62. Indicia marks 66 are preferably provided on the opposing side surfaces 22, 24, 26, 28 of the base 12 to aid in positioning the electrically conductive probing contact 14 over the contact point. The indicia marks 66 define a line on which the aperture 50 of the positioned. The adhesive surface 70 of the compliant material 16 fixes the adapter to the circuit board 60 with application of downward pressure on the adapter 10. Once the adapter 10 is secured to the circuit board 60, the electrically conductive probing contact 14 is tuned to screw the contact 14 further into the base 12 and extend the pointed contact member 46 past the bottom 18 of the base 12 to contact the circuit run 62. Once the pointed contact member 46 comes in contact with the trace 62, continued turning of the electrically conductive probing contact 14 causes the foam of the compliant adhesive material 16 to stretch. The foam maintains force between the pointed contact member 46 and the circuit board 60 after the turning of the probing contact 14 is completed. A measurement probe 72 is connected to the electrical contact 14 by using the square pin connector or inserting a probing tip on the probe 72 into the aperture 56 formed in the extended portion 52 of the body member 44. Once measurements have been completed, the adapter 10 can be removed from the circuit board 60.

Figure 3:
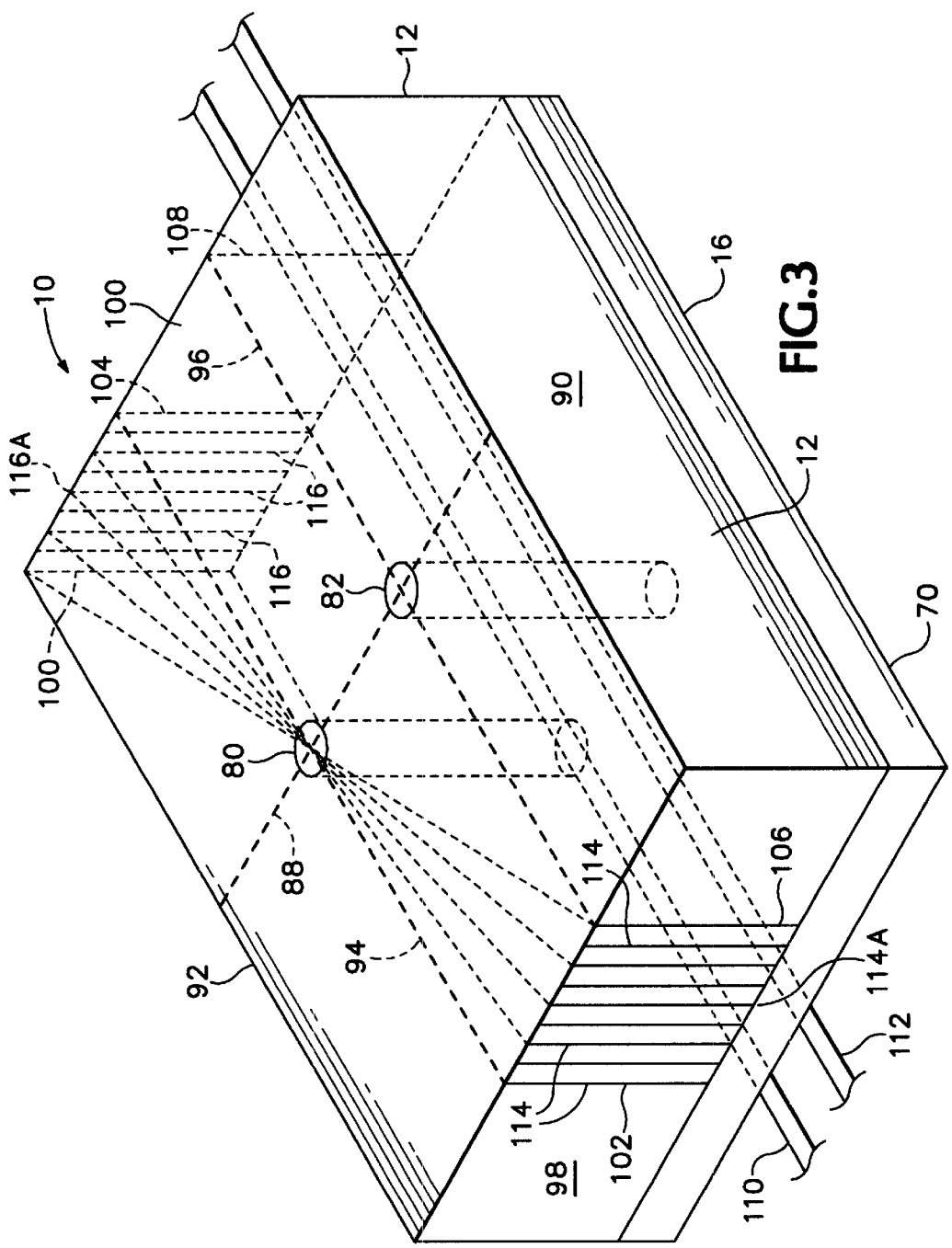
FIG. 3 is a perspective view of an additional configuration of the attachable/detachable probe point adapter according to the present invention.
Figure 4:
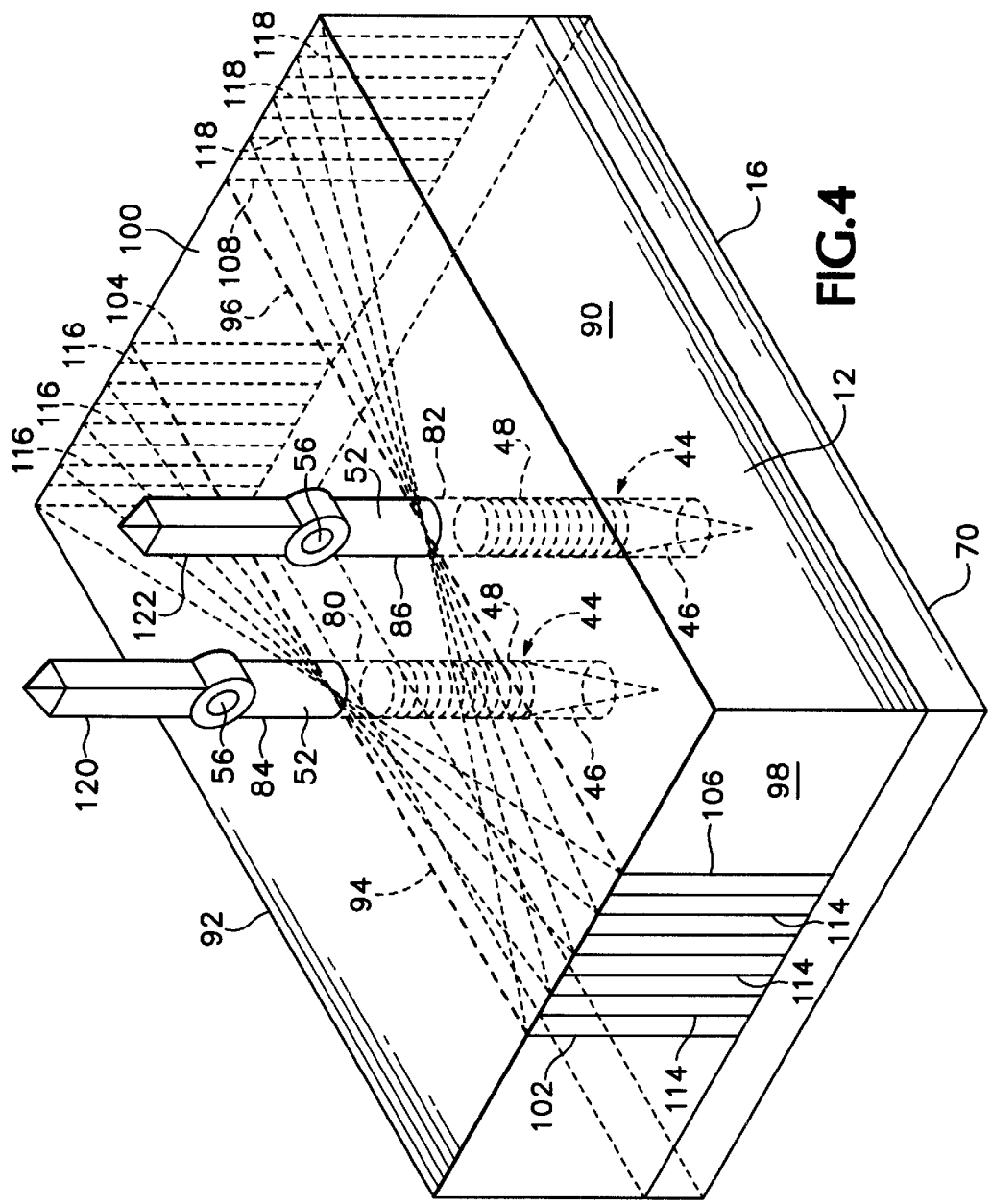
FIG. 4 is a perspective view of the additional configuration of the attachable/detachable probe point adapter according to the present invention with multiple electrically conductive probing contacts.

FIGS. 3 and 4 show perspective views of a further configuration of attachable/detachable probe point adapter 10 of the present invention. In this embodiment multiple apertures 80, 82 are formed in the base 12 and receive corresponding electrically conductive probing contacts 84 and 86. The apertures 80, 82 are positioned parallel to each other on a line 88 orthogonal to one set of opposing side surfaces 90 and 92 as shown in the figure and offset from each other on separate lines 94 and 96 orthogonal to the other set of opposing side surfaces 98 and 100. The position of the apertures in the figures are by example only. The apertures generally may be positioned at any location in the base.

Indicia marks 102, 104 and 106, 108 are preferably provided on the opposing side surfaces 98 and 100 of the base 12 in line with lines 94 and 96 to aid in positioning the respective electrically conductive probing contacts 84 and 86 over contact points, such as circuit board traces 110 and 112. A series of additional indicia marks 114 may be formed on one of the opposing side surfaces 98 and 100 between the indicia marks 102 and 106. Additional sets of indicia marks 116 and 118 may be formed on the other opposing side surface 90 and 100 that extend from the respective indicia marks 104 and 108 outward toward the corners of the base 12. Indicia marks 114 and 116 are associated with aperture 80 when the aperture 80 is used as the point of rotation of the adapter 10 and indicia marks 114 and 118 are associated with aperture 82 when the aperture 82 is used as the point of rotation of the adapter 10. Rotating the adapter 10 about either of the apertures 80 and 82 varies the relative spacing between the apertures 80 and 82 relative to contact points on the circuit board. For example, the center to center spacing between the apertures is 0.150 inches and the center to center spacing between the circuit board traces 110 and 112 is 0.020 inches. The adapter 10 may be rotated in a clockwise direction about the aperture 80 to position indicia marks 114A and 16A on trace 110, which represents a center to center spacing of 0.020 between the treaded apertures 80 and 82 relative to the traces 110 and 112. The aperture 82 may equally be used as the rotation point in which case the adapter 10 is rotated in a counter-clockwise direction to vary the spacing the apertures 80 and 82.

The electrically conductive probing contacts 84 and 86 in FIG. 4 are configured with vertically disposed contacts 120 and 122. The electrically conductive probing contact 84 and 86 are formed from in a similar manner to the previously described contact 14 using the same materials and plating thicknesses. The body member 44 tapers into the pointed contact member 46 below the threaded portion 48 of the body member 44 and has the same overall dimensions as previously described. The portion 52 of the body member 44 extending upward from the base 12 has similar overall dimensions as previously described with different sizes of square pin contacts 120, 122 being formed from the body member.

The manner in which the adapter 10 is used with multiple probing contacts is similar to its use with a single contact. The adapter 10 is prepared for mounting on the circuit board by removing the protective sheet from the compliant adhesive material 16. The pointed contact members 46 is disposed within the apertures 80, 82 at this time. One of the apertures 80, 82 is selected as the point of rotation and positioned over one of the circuit trace 110, 112, which in FIG. 3 is trace 110. The appropriate indicia marks 114 and 116 that define the proper center to center spacing between the apertures 80 and 82 for the center to center spacing of the circuit traces 110, 112 are aligned with trace 110. The adapter 10 placed on the traces 110, 112 with the adhesive surface 70 of the compliant material 16 fixing the adapter to the circuit board with application of downward pressure on the adapter 10. Once the adapter 10 is secured to the circuit board, the electrically conductive probing contacts 84, 86 are tuned to screw the contacts 84, 86 further into the base 12 to extend the pointed contact members 46 past the bottom 18 of the base 12 and contact the circuit traces 110, 112 Once the pointed contact members 46 comes in contact with the traces 110, 112, continued turning of the electrically conductive probing contacts 84, 86 causes the foam of the compliant adhesive material 16 to stretch. The foam maintains force between the pointed contact members 46 and the circuit board after the turning of the probing contacts 84, 86 are completed. A measurement probe 72, such as the one shown in FIG. 1, is connected to the electrical contacts 84, 86 by using the square pin connector or inserting a probing tip on the probe 72 into the aperture 56 formed in the extended portion 52 of the body member 44. Once measurements have been completed, the adapter 10 can be removed from the circuit board.

An attachable/detachable probe point adapter 10 for use with a measurement test probe has been described having a base with one or more apertures formed therein. One or more electrically conductive probing contacts, corresponding to the number of apertures, are threadably mounted in the apertures. The contacts have a body member and a pointed contact member with a portion of the body member and the pointed contact member being in or below the adapter. The pointed contact member is extendable from a first position within the aperture to a second protruding position outside the aperture at the bottom surface of the base. A portion of the body member extends from the top surface of the base. A compliant adhesive material formed on the bottom surface of the base for securing the probe point adapter to a device under test. The attachable/detachable probe point adapter 10 is designed to provide a temporary test point or square pin connection to a device or circuit board under test.

It will be obvious to those having skill in the art that many changes may be made to the details of the above-described embodiments of this invention without departing from the underlying principles thereof. The scope of the present invention should, therefore, be determined only by the following claims.

What is claimed is:

1. An attachable/detachable probe point adapter comprising:

a base having top, bottom and at least a first side surfaces with at least a first aperture formed therein that extends from the top to the bottom surfaces;

a compliant adhesive material disposed on the bottom surface of the base; and at least a first electrically conductive probing contact having at least a partially threaded body member and a pointed contact member disposed in the aperture with a portion of the body member extending from the top surface of the base and the pointed contact member extendable from a first position within the aperture to a second protruding position outside the aperture at the bottom surface of the base.

2. The attachable/detachable probe point adapter as recited in claim 1 wherein the aperture further comprises an interior surface wall having threads formed therein.

3. The attachable/detachable probe point adapter as recited in claim 1 wherein the base further comprises opposing side surfaces and equal first and second axes extending between opposing corners of the side surfaces.

4. The attachable/detachable probe point adapter as recited in claim 3 wherein the aperture is positioned at the intersection of the axes.

5. The attachable/detachable probe point adapter as recited in claim 3 wherein the base is rectangular shaped and formed of a non-conductive material.

6. The attachable/detachable probe point adapter as recited in claim 1 wherein the base further comprises opposing side surfaces and unequal first and second perpendicular axes extending between opposing corners of the base.

7. The attachable/detachable probe point adapter as recited in claim 6 wherein the aperture is positioned at the intersection of the perpendicular axes.

8. The attachable/detachable probe point adapter as recited in claim 6 wherein the base is diamond shaped and formed of a non-conductive material.

9. The attachable/detachable probe point adapter as recited in claim 1 wherein the base further comprises a circular side surface defined by a radius extending from the center of the base.

10. The attachable/detachable probe point adapter as recited in claim 9 wherein the aperture is positioned at the center of the base.

11. The attachable/detachable probe point adapter as recited in claim 1 wherein the base further comprises opposing side surfaces with at least two of the side surfaces having at least a first indicia mark formed thereon defining a line with the aperture positioned on the line.

12. The attachable/detachable probe point adapter as recited in claim 1 wherein the base further comprises a plurality of apertures formed therein that extend from the top to the bottom surfaces.

13. The attachable/detachable probe point adapter as recited in claim 12 further comprises a plurality of electrically conductive probing contacts corresponding to and disposed in the plurality of apertures.

14. The attachable/detachable probe point adapter as recited in claim 1 wherein the each of the plurality of apertures further comprises an interior surface wall having threads formed therein.

15. The attachable/detachable probe point adapter as recited in claim 13 wherein the base further comprises opposing side surfaces with at least two of the side surfaces having a plurality of indicia marks formed thereon defining a plurality of lines with one of the plurality of apertures being positioned on each of the plurality of lines.

16. The attachable/detachable probe point adapter as recited in claim 13 wherein the base further comprises opposing side surfaces with at two of the opposing side surfaces having a plurality of indicia marks formed thereon defining a plurality of lines that pass through one of the plurality of apertures.

* * * * *